United States Patent [19]

Koda

[11] Patent Number: 4,522,469

[45] Date of Patent: Jun. 11, 1985

[54] LIQUID CRYSTAL LIGHT VALVE STRUCTURES

[75] Inventor: N. John Koda, Vista, Calif.

[73] Assignee: The United States of America as represented by the Administrator of the National Aeronautics and Space Administration, Washington, D.C.

[21] Appl. No.: 569,372

[22] Filed: Jan. 9, 1984

[51] Int. Cl.³ .............................................. C23C 15/00
[52] U.S. Cl. ................................ 350/342; 204/192 C; 204/192 P; 428/432; 428/698; 428/913
[58] Field of Search .................... 204/192 C, 192 P; 350/342; 428/432, 698, 913

[56] References Cited

U.S. PATENT DOCUMENTS

| | | | |
|---|---|---|---|
| 3,824,002 | 7/1974 | Beard | 350/342 |
| 3,976,361 | 8/1976 | Fraas et al. | 350/342 |
| 4,019,807 | 4/1977 | Boswell et al. | 350/342 |
| 4,025,339 | 5/1977 | Kuehnle | 430/63 |

OTHER PUBLICATIONS

S. R. Jost, A New Light-Modulated Liquid-Crystal Light Valve, *J. Appl. Phys.*, vol. 49, No. 10, Oct. 1978, pp. 5332–5333.
D. B. Fraser, Sputtered Films For Display Devices, Proceedings of the IEEE, vol. 61, No. 7, Jul. 1973, pp. 1013–1018.
Thin Solid Films, "Sputter-Deposited Films for Display Devices," Author-D. B. Fraser, May 1972, pp. 407–412.
Proceedings, 2nd European Community, Photovoltaic Solar Energy Conference, "Preparation and Properties of Nitrogen-Doped Amorphous Silicon," Author-Hack et al., 1979, pp. 278–286.

*Primary Examiner*—G. L. Kaplan
*Assistant Examiner*—William T. Leader
*Attorney, Agent, or Firm*—Russell E. Schlorff; John R. Manning; Marvin F. Matthews

[57] ABSTRACT

An improved photosensor film and liquid crystal light valves embodying said film is provided. The photosensor film and liquid crystal light valve is characterized by a significant lower image retention time while maintaining acceptable photosensitivity. The photosensor film is produced by sputter depositing CdS onto an ITO substrate in an atmosphere of aqrgon/$H_2S$ gas while maintaining the substrate at a temperature in the range of about 130° C. to about 200° C. and while introducing nitrogen gas into the system to the extent of not more than about 1% of plasma mixture. Following sputter deposition of the CdS, the film is annealed in an inert gas at temperatures ranging from about 300° C. to about 425° C.

12 Claims, No Drawings

LIQUID CRYSTAL LIGHT VALVE STRUCTURES

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; U.S.C. 2457).

TECHNICAL FIELD

This invention relates to liquid crystal light valve structures. More particularly, this invention relates to an improved photosensor layer or film which is an integral part of the conventional liquid crystal light valve structure.

BACKGROUND ART

Display devices incorporating liquid crystal light valve structures are well known in the art. A liquid crystal light valve is a multilayer structure. Among the various layers in the multilayer structure is a transparent conductor or electrode film on which has been deposited a photosensor layer.

The transparent conductor or electrode film must provide adequate conductivity in a plane and adequate light transmission through the plane. An alloy of $In_2O_3:Sn$ is commonly used for this purpose and is referred to in the art as an ITO film. Such films may be deposited on a suitable fiber optics substrate, such as glass, by chemical reaction, evaporation or by sputtering, a technique also well known in the art.

A commonly used material for the photosensor layer or film is cadmium sulfide (CdS). Photosensor layers of CdS can be formed by precipitation from solution, evaporation and by sputtering. U.S. Pat. Nos. 3,976,361 and 4,025,339 contain much background information on the films herein mentioned and deposition techniques.

Display devices employing conventional liquid crystal light valves to be used on the Space Shuttle Mission Simulator showed objectionable image retention when the display changed from highlight to lower brightness displays. The image retention problem manifested itself as a negative of the previous image superimposed on the current image in the display. The problem was ultimately determined to reside in the CdS photosensor layer or film in the liquid crystal light valve.

It is an object of this invention to provide an improved photosensor layer or film of CdS, the film and a liquid crystal light valve employing said film exhibiting minimum image retention time while maintaining acceptable sensitivity. It is also an object of this invention to provide an improved process for producing the aforementioned photosensor layer or film of CdS. Other objects will become apparent from the description of the invention.

DISCLOSURE OF INVENTION

In accordance with this invention an improved photosensor layer or film for use in liquid crystal light valves is prepared by sputter depositing CdS onto an ITO substrate in an atmosphere of Argon/$H_2S$ gas while maintaining the ambient temperature for the substrate in the range of from about 130° C. to about 200° C. During sputter deposition, nitrogen gas is introduced into the system as a dopant to the extent of not more than about 1% of total gaseous or plasma mixture. Following deposition of the CdS film, the film is annealed in an inert gas, such as argon, at a temperature ranging from about 300° C. to about 425° C. Photosensor layers or films so prepared, and liquid crystal light valves embodying such photosensors, exhibited significantly reduced image retention times (negative memory) while retaining acceptable photo sensitivity.

DESCRIPTION OF THE PREFERRED EMBODIMENT

The transparent conductor employed in these test runs consisted of an ITO film ($In_2O_3:Sn$) deposited by evaporation onto a glass substrate. The transparent conductor was placed in a suitable sputtering chamber. Provision was made to control the ambient temperature of the transparent conductor substrate during the sputtering process. The cathode or target consisted of an 8-inch (20 cm.) target of pure, scintered CdS. The radio frequency sputtering was carried out at 150 watts. The sputtering chamber was evacuated and argon gas containing about 2% $H_2S$ was introduced into the chamber through a suitable leak valve, maintaining plasma vapor within the chamber at a partial pressure of 15 millitorrs. Provision was also made to bleed nitrogen into the sputtering chamber during deposition through a leak valve which was adjusted to a partial pressure of about $2 \times 10^{-6}$ mm. for a background pressure of about $1 \times 10^{-5}$ mm. (or 20%) before the $H_2S$-Argon gas was introduced to a pressure of 15 millitorrs.

A series of photosensor films were deposited as above described at various substrate temperatures and nitrogen contents in the plasma vapor. In each case, following deposition of the photosensor film, the sensor was activated by annealing in pure argon gas at 425° C. for up to 20 minutes. After annealing, a small electrode was placed on the surface of the CdS film to permit testing for sensitivity and image retention time. In the typical results set forth in the following Table 1, image retention time is reported as Negative Memory (NM) in terms of seconds. Sensitivity is reported as the Switching Ratio (SR) which is the ratio of current amplitudes for the various light inputs relative to the dark signal. An SR of approximately 2 or greater indicates acceptable photo sensitivity. The nitrogen amount listed is the percent of the background gas before the introduction of the Argon-$H_2S$ gas mixture to 15 millitorr pressure. Therefore, actual $N_2$ content of the plasma mixture during deposition is less than 1%.

TABLE I

| Run No. | Substrate Temperature | Nitrogen % of background Pressure | SR | NM |
|---|---|---|---|---|
| 1 | 147° C. | 0 | 2.51 | 25 sec. |
| 2 | 149° C. | 0 | 2.05 | 22 sec. |
| 3 | 153° C. | 0 | 2.54 | 31 sec. |
| 4 | 162° C. | 0 | 1.97 | 32 sec. |
| 5 | 143° | 17% | 2.39 | 14 sec. |
| 6 | 144° C. | 22% | 2.84 | 11 sec. |
| 7 | 148° C. | 30% | 2.34 | 5 sec. |
| 8 | 145° C. | 40% | 2.18 | 3 sec. |
| 9 | 138° C. | 70% | 2.22 | 0 sec. |

The results set forth in Table 1 clearly show the enhanced improvement in NM of the photosensors obtained with nitrogen doping.

The effect is even more pronounced in liquid crystal light valves embodying photosensors as above described. Proceeding from the input side to the output side of the liquid crystal light valve, the layers consisted of glass, an ITO layer, a CdS photosensor layer, an opaque light blocking layer, a multilayered dielectric film, a liquid crystal layer, another ITO layer and, finally, glass. The construction and operation of such liquid crystal light valves are comprehensively described by W. P. Bleha, L. T. Lipton, E. Wiener-Avnear, J. Grinberg, P. G. Reif, David Casasent, H. B. Brown and B. V. Markevitch, Optical Engineering, Vol. 17, Pg. 371(1978). Such liquid crystal light valves embodying photosensor films prepared without nitrogen doping typically exhibited NM ranging from 30 seconds to one minute which was unacceptable in the Space Shuttle Mission Simulator displays.

As shown in Table 1, photosensors prepared with nitrogen doping exhibit much lower NM while still retaining the desired high sensitivity. The NM parameter for multilayered liquid crystal light valves previously described but embodying these photosensors was also significantly improved. Higher nitrogen doping consistently resulted in light valves having an NM performance below 10 seconds while maintaining an acceptable SR of above 2.

The process parameters for preparing the novel improved photosensors of this invention are subject to some variation. For example, the extent of nitrogen doping during the radio frequency sputter deposition of CdS in a plasma of argon/$H_2S$ can be varied. Nitrogen contents of the total plasma of not more than about 1% by volume produce advantageous results. Particularly advantageous results are realized at the higher concentration of nitrogen.

The temperature of the substrate environment on which the CdS is sputter deposited can be varied from about 130° C. to about 200° C. Both photo sensitivity and negative memory vary directly with the temperature maintained. Lower temperatures result in lower negative memory and lower switching ratios.

After sputter deposition of the CdS film, the film is activated by annealing at a temperature in the range of from about 300° C. to about 425° C. in an atmosphere of an inert gas such as argon. Gases such as krypton, xenon, neon, etc. may also be used. Twenty minutes annealing time at 425° C. has been found to be adequate. Somewhat longer times would be required at the lower temperatures.

While the improved photosensors described herein have particular utility in the liquid crystal light valves in NASA's Space Mission Simulation projectors, their utility is not so limited. Such photosensors also have utility in projection television displays where image retention is objectionable.

What is claimed is:

1. In a process for the production of a photosensor film to be incorporated into a liquid crystal light valve, said film and light valve characterized by improved low negative memory, and wherein the photosensor film is prepared by radio frequency sputter depositing CdS onto a suitable substrate in a plasma vapor of argon containing minor amounts of $H_2S$, the improvement comprising introducing, during the sputtering process, nitrogen in the amount of not more than about 1% of the plasma vapor while maintaining the substrate ambient temperature in the range of from about 130° C. to about 200° C. and annealing the resultant photosensor film in an inert atmosphere at temperatures in the range of from about 300° C. to about 425° C.

2. The process of claim 1 wherein the plasma vapor is argon containing about 2% $H_2S$ by volume.

3. The process of claim 2 wherein the photosensor is annealed in an atmosphere of argon.

4. A photosensor film produced by the process of claim 1.

5. A photosensor film produced by the process of claim 2.

6. A photosensor film produced by the process of claim 3.

7. A liquid crystal light valve embodying a photosensor film produced by the process of claim 1.

8. A liquid crystal light valve embodying a photosensor film produced by the process of claim 2.

9. A liquid crystal light valve embodying a photosensor film produced by the process of claim 3.

10. A liquid crystal light valve having a layered structure with the layers comprising, in sequence, glass, an ITO layer, a CdS photosensor layer, an opaque light blocking layer, a multilayered dielectric film, a liquid crystal layer, an ITO layer and glass, wherein the CdS photosensor layer is produced by the process of claim 1.

11. A liquid crystal light valve having a layered structure with the layers comprising, in sequence, glass, an ITO layer, a CdS photosensor layer, an opaque light blocking layer, a multilayered dielectric film, a liquid crystal layer, an ITO layer and glass, wherein the CdS photosensor layer is produced by the process of claim 2.

12. A liquid crystal light valve having a layered structure with the layers comprising, in sequence, glass, an ITO layer, a CdS photosensor layer, an opaque light blocking layer, a multilayered dielectric film, a liquid crystal layer, an ITO layer and glass, wherein the CdS photosensor layer is produced by the process of claim 3.

* * * * *